US008569143B2

(12) United States Patent
Kammler et al.

(10) Patent No.: US 8,569,143 B2
(45) Date of Patent: Oct. 29, 2013

(54) METHODS OF FABRICATING A SEMICONDUCTOR IC HAVING A HARDENED SHALLOW TRENCH ISOLATION (STI)

(75) Inventors: Thorsten Kammler, Ottendorf-Okrilla (DE); Joerg Radecker, Dresden (DE); Christof Streck, Coswig (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 274 days.

(21) Appl. No.: 13/167,558

(22) Filed: Jun. 23, 2011

(65) Prior Publication Data

US 2012/0329239 A1    Dec. 27, 2012

(51) Int. Cl.
*H01L 21/762* (2006.01)
(52) U.S. Cl.
USPC .................................. 438/424; 257/E21.546
(58) Field of Classification Search
USPC .................................. 438/424; 257/E21.546
See application file for complete search history.

(56) References Cited

U.S. PATENT DOCUMENTS

| | | | |
|---|---|---|---|
| 6,100,160 A * | 8/2000 | Hames | 438/424 |
| 2002/0177270 A1* | 11/2002 | Beyer et al. | 438/221 |
| 2006/0160322 A1* | 7/2006 | Buehrer et al. | 438/424 |
| 2008/0090379 A1* | 4/2008 | Buehrer et al. | 438/435 |
| 2011/0151678 A1* | 6/2011 | Ashtiani et al. | 438/786 |

* cited by examiner

*Primary Examiner* — Alexander Ghyka
*Assistant Examiner* — Stanetta Isaac
(74) *Attorney, Agent, or Firm* — Ingrassia Fisher & Lorenz, P.C.

(57) ABSTRACT

Methods and provided for fabricating a semiconductor IC having a hardened shallow trench isolation (STI). In accordance with one embodiment the method includes providing a semiconductor substrate and forming an etch mask having an opening exposing a portion the semiconductor substrate. The exposed portion is etched to form a trench extending into the semiconductor substrate and an oxide is deposited to at least partially fill the trench. At least the surface portion of the oxide is plasma nitrided to form a nitrided oxide layer and then the etch mask is removed.

16 Claims, 4 Drawing Sheets

METHODS OF FABRICATING A SEMICONDUCTOR IC HAVING A HARDENED SHALLOW TRENCH ISOLATION (STI)

TECHNICAL FIELD

The present invention generally relates to methods for fabricating a semiconductor integrated circuit (IC), and more particularly relates to methods for fabricating a semiconductor IC having a hardened shallow trench isolation.

BACKGROUND

In the fabrication of semiconductor integrated circuits (ICs) it is typical, at an early stage in the fabrication process, to form isolation regions that provide electrical isolation between various parts of the circuit. One such isolation region is the shallow trench isolation (STI). STI is basically a trench etched into the surface of a semiconductor substrate in the location where isolation is needed that is filled with an insulating material such as a silicon oxide.

As ICs become more complex and incorporate more and more devices it becomes necessary to reduce device size. Reducing device size also implies that the width of STI trenches must be reduced. Reliably filling STI trenches is difficult when the minimum feature size, that is the minimum line width and spacing used in designing a device, decreases to 40 nanometers (nm) or even less. Conventional oxide filling using, for example, low pressure chemical vapor deposition (LPCVD) or high density plasma chemical vapor deposition (HDP) is ineffective. Such techniques cannot reliably fill high aspect ratio trenches. Other materials and processes such as spin-on-glasses have been developed to fill high aspect ratio trenches but such fill materials tend to be soft and thus sensitive to etchants used during etching steps and to cleaning agents, especially those containing hydrofluoric acid, that are used in subsequent processes. Loss of fill material from the STI results in a non-uniform topography which, in turn, causes yield limiting process problems. The loss of fill material also causes undesirable device performance variations.

Accordingly, it is desirable to provide high yielding methods for fabricating semiconductor integrated circuits having reduced STI fill loss. In addition, it is desirable to provide methods for fabricating semiconductor ICs having hardened shallow trench isolation fill. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a semiconductor IC having a hardened shallow trench isolation (STI). In accordance with one embodiment the method includes providing a semiconductor substrate and forming an etch mask having an opening exposing a portion of the semiconductor substrate. The exposed portion is etched to form a trench extending into the semiconductor substrate and an oxide is deposited to at least partially fill the trench. At least the surface portion of the oxide is plasma nitrided to form a nitrided oxide layer and then the etch mask is removed.

In accordance with a further embodiment a method for fabricating a semiconductor IC includes depositing a layer of silicon nitride overlying a semiconductor substrate, applying and patterning a layer of photoresist to form an etch mask having an opening exposing a portion of the layer of silicon nitride, and etching the portion of the layer of silicon nitride. A trench is etched extending into the semiconductor substrate underlying the portion of the layer of silicon nitride and is filled with an oxide material. A CMP operation is performed to remove oxide material overlying the layer of silicon nitride and a surface of the oxide material within the trench is deglazed. A nitrided oxide layer is formed at the surface of the oxide material by subjecting the surface of the oxide material to a nitrogen-containing plasma.

In accordance with yet another embodiment a method for fabricating a semiconductor IC in and on a semiconductor substrate includes etching an isolation trench extending into the surface of a semiconductor substrate and substantially filling the trench with an oxide material. A planarizing operation is performed to remove a portion of the oxide material and to expose a surface of the oxide material in the trench. A portion of the oxide material is then plasma nitrided to form a nitrided oxide layer at the surface.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIG. 1 and FIGS. 2-9 illustrate, in flow chart form and in cross sectional views, respectively, methods for fabricating a semiconductor integrated circuit (IC) 200 in accordance with various embodiments. Only a portion of the semiconductor IC is illustrated. Various steps in the manufacture of ICs are well known to those of skill in the art and so, in the interest of brevity, many conventional steps will only be mentioned briefly herein or will be omitted entirely without providing the well known process details.

Figure 1:
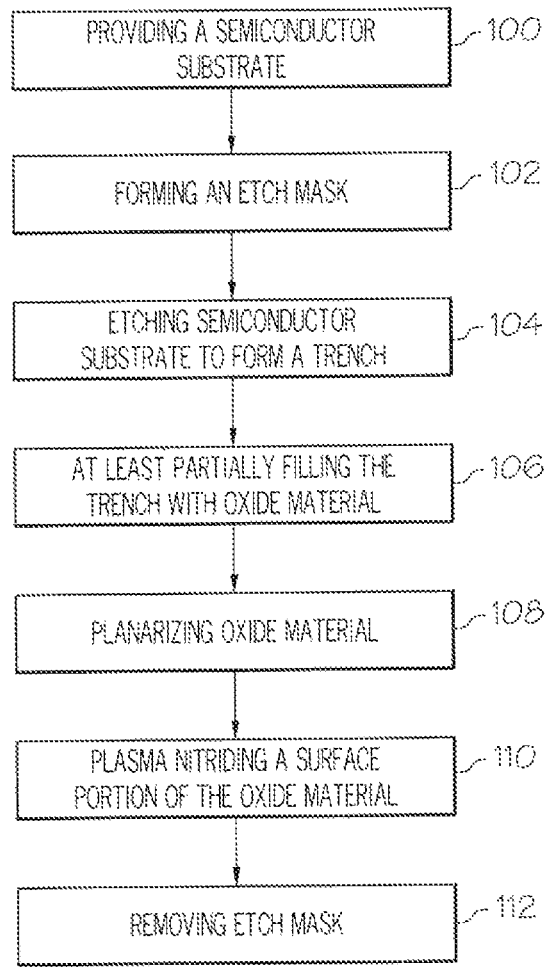
FIG. 1 illustrates, in flow chart form, methods for fabricating an integrated circuit (IC) in accordance with various embodiments.
Figure 2:
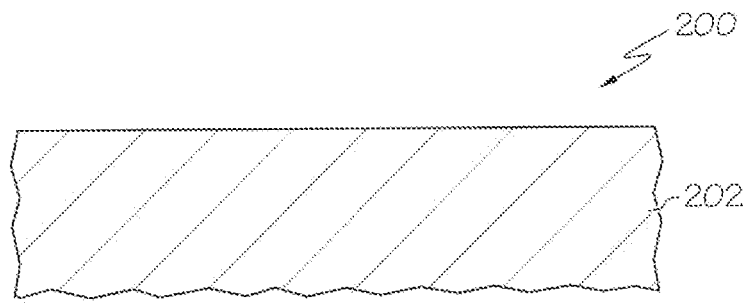
FIGS. 2-9 illustrate, in cross sectional views, methods for fabricating a semiconductor IC in accordance with various embodiments.

As illustrated in FIGS. 1 and 2, fabrication of IC 200 begins, in accordance with one embodiment, by providing a semiconductor substrate 202 (Step 100). Semiconductor substrate 202 can be a wafer of silicon, silicon admixed with germanium, or other semiconductor material commonly used in the manufacture of integrated circuits and will hereinafter be referred to, for convenience but without limitation, as a semiconductor substrate or wafer. Semiconductor substrate 202 can be a bulk semiconductor wafer, as illustrated, or a semiconductor on insulator (SOI) substrate.

Figure 3:
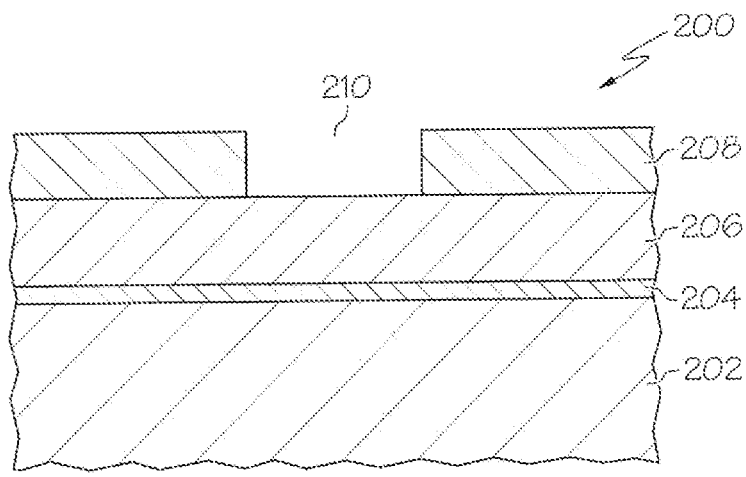
Figure 4:
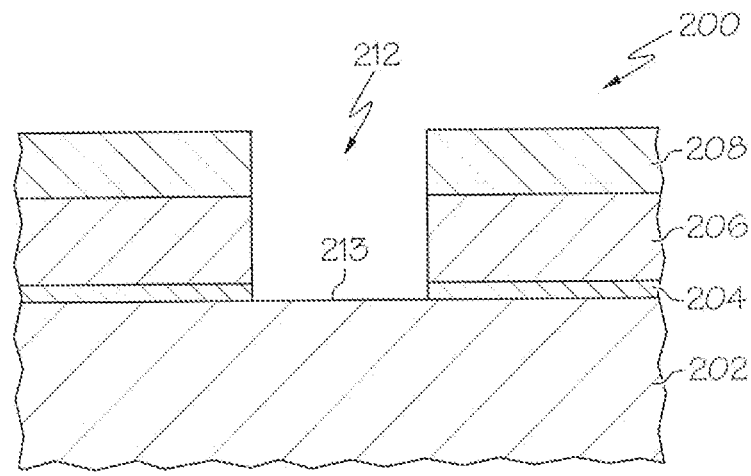

An etch mask is formed overlying the semiconductor substrate (Step 102, FIG. 1). The etch mask can be formed, for example, by providing a pad oxide layer 204 and a silicon nitride layer 206 overlying the semiconductor substrate as illustrated in FIG. 3. The pad oxide layer can be grown, for example, by thermal oxidation to a thickness of 8-10 nm and the silicon nitride layer can be deposited to a thickness of 800-900 nm by chemical vapor deposition (CVD), low pressure chemical vapor deposition (LPCVD), or the like. A layer of photoresist 208 is applied overlying the silicon nitride layer and is photolithographically patterned to form an etch mask having an opening 210 exposing a portion of the layer of silicon nitride. Other layers such as antireflective coatings, planarizing layers and the like may also be deposited overlying the layer of silicon nitride, but such layers are well known to those of skill in the art and so need not be described or illustrated. Using the patterned layer of photoresist as an etch mask, the layer of silicon nitride and the pad oxide layer are etched to form an opening 212 to expose a portion 213 of the semiconductor substrate as illustrated in FIG. 4. After etching the layers of silicon nitride and pad oxide the layer of photoresist can be removed or can be retained as described below.

Figure 5:
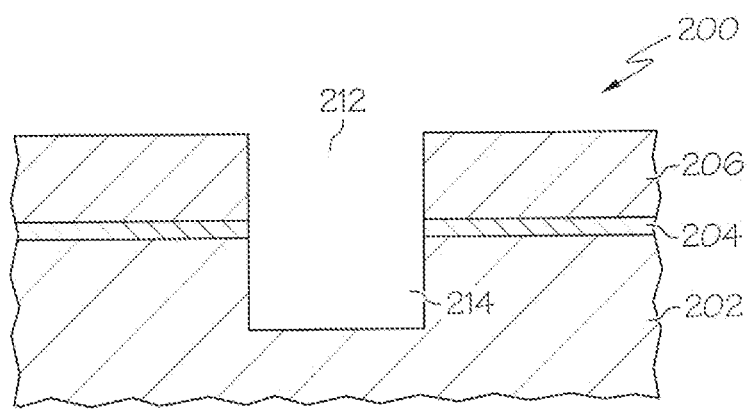

The patterned layer of silicon nitride, having an opening 212, either alone or in combination with the patterned layer of photoresist, is used as an etch mask to etch the exposed portion 213 of semiconductor substrate 202 to form a trench 214 as illustrated in FIG. 5 extending into the semiconductor substrate (Step 104, FIG. 1). The depth of trench 214 depends on the requirements of the circuit being implemented, but in accordance with one embodiment can have a depth of 200-400 nm for a circuit implemented on a bulk semiconductor wafer. The trench is typically etched anisotropically, for example by reactive ion etching (RIE) to achieve substantially vertical side walls. The substantially vertical side walls conserve space on the surface of the semiconductor substrate, but add to the difficulty of reliably filling the trench in subsequent steps. If not already removed, the layer of patterned photoresist is removed after the etching of trench 214.

Figure 6:
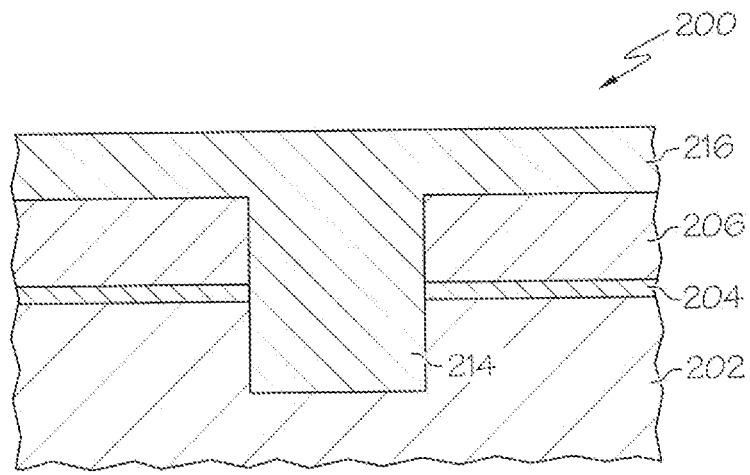

As illustrated in FIG. 6, the method in accordance with one embodiment continues by at least partially filling trench 214 with a deposited oxide material 216 (Step 106, FIG. 1). The trench may also be partially filled with a trench liner (not illustrated). The trench liner can be, for example, a thin layer of silicon dioxide grown by thermal oxidation on the walls of the trench. The deposited oxide can be, for example HARP or eHARP, the equipment and process for each being commercially available from Applied Materials, Inc. of Santa Clara, Calif., or a spin-on glass material. The deposited oxide is selected from materials capable of providing electrical isolation between regions of the semiconductor material on opposite sides of trench 214 and also capable of reliably filling the trench. The deposited oxide is blanket deposited and completes the filling of trench 214 and covers layer of nitride 206

Figure 7:
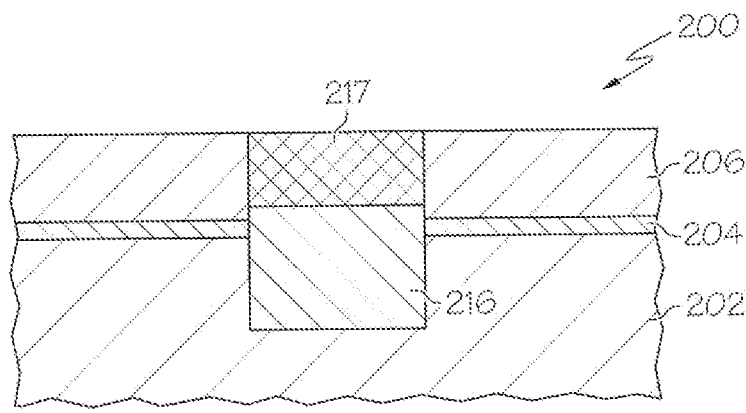

In accordance with one embodiment deposited oxide material 216 is planarized (Step 108, FIG. 1) as illustrated in FIG. 7. The oxide material can be planarized, for example by the process of chemical mechanical planarization (CMP). The CMP process continues until the patterned layer of silicon nitride 206 is reached, with the silicon nitride acting as a stop for the CMP. In a further embodiment the planarization is followed by a deglazing etch. The deglaze etchant is selected to be highly selective to etching oxide. The etchant can be, for example, dilute hydrofluoric acid with a dilution of between 1:100 and 1:500. The deglazing can also be done by plasma etching, for example in a $CF_4$ etchant chemistry. The deglazing etch not only removes any residual oxide material on the surface of the layer of silicon nitride, but can also be continued to adjust the height of the STI relative to the surface of the semiconductor substrate. For example, as illustrated, a portion 217 of the deposited oxide is removed to recess the top surface of the STI below the top of the layer of silicon nitride and to leave a remaining portion of deposited oxide 216 nearly co-planar with the surface of the semiconductor substrate.

Figure 8:
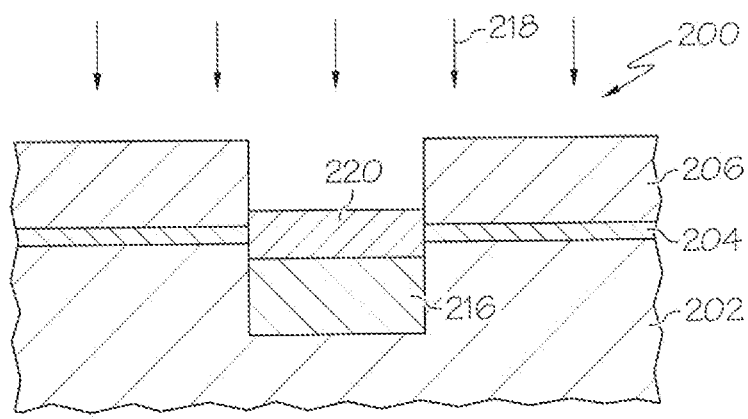

The method in accordance with an embodiment continues, as illustrated in FIG. 8 by plasma nitriding at least a surface portion of oxide material 216 (Step 110, FIG. 1). The surface of oxide material 216 is subjected to a nitrogen plasma as schematically illustrated by arrows 218 to form a layer 220 of nitrided oxide at the surface of the oxide material. The thickness of the layer of nitrided oxide and the amount of nitrogen incorporated into the oxide are dependent on a number of process parameters as discussed below. The thickness and nitrogen content are selected based on the hardness of the STI oxide needed to withstand subsequent processing steps. The plasma nitriding is accomplished in a plasma reactor generally in the range of 200 to 500° C. and preferably at a temperature of about 400° C. Pressure in the plasma reactor can be maintained, for example, at a pressure from 1 to 10 Torr. In general any nitrogen source can be used to supply the nitrogen to the plasma. For a high nitrogen content, a mixture of $NH_3$ with nitrogen, helium, or argon or mixtures thereof has been shown to be beneficial. For a medium or low nitrogen content the source gas instead can be nitrogen mixed with helium and/or argon. In some applications it is advantageous to use cycles with $N_3$ as a source gas if nitridation/etch cycles are needed. The surface of the oxide material can be subjected to a nitrogen plasma using, for example, $NH_3$ as a reactant and in at least one cycle to a nitrogen plasma using $NF_3$ as a reactant.

Plasma reactors generally have two power supplies that can be adjusted to tune the quality and thickness of the nitrided oxide layer. A high frequency power source (typically 13.56 MHz) is used to ignite the nitrogen-containing plasma. The power level of the high frequency source and the length of the nitriding process can be adjusted to determine the amount of nitrogen incorporated into the oxide. The power of the high frequency power source typically ranges from 200 to 1500 Watts. A low frequency power source (typically 350 KHz) can be adjusted to bias ion flow toward the semiconductor substrate and the surface of the oxide material. By adjusting the power level of the low frequency power source, and thus the bias of the ion flow, the thickness of the nitrided oxide layer can be controlled. The power of the low frequency power source typically ranges from 50 to 1000 Watts. Without the low frequency power source and with only the high frequency power source the typical thickness of layer 220 of nitrided oxide is about 1 nm or less. Using the low frequency power source in addition to the high frequency power source the thickness of layer 220 of nitrided oxide can range from about 1 to 20 nm. The advantage of the plasma nitridation to create nitrided oxide layer 220 is that the quality as well as the thickness of the layer can be tuned, as needed for the fabrication process being implemented, in a wide range and with good uniformity across the entire semiconductor substrate. The nitrided oxide layer is more resistant to oxide etchants than is the un-nitrided oxide used to fill trench 214.

Figure 9:
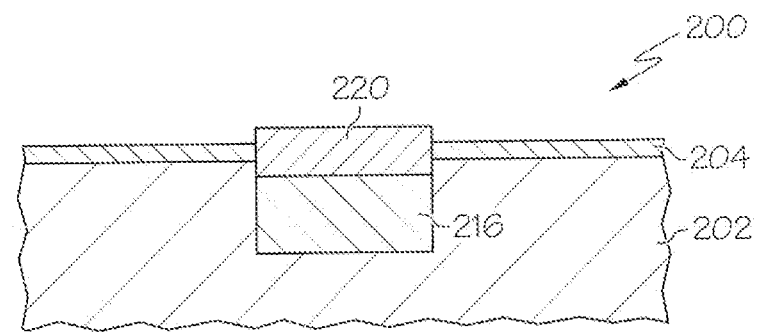

As illustrated in FIG. 9, this portion of the method for fabricating a semiconductor IC, is completed by removing the patterned layer of silicon nitride 206 (Step 112, FIG. 1) which has served as the etch mask. The patterned layer of silicon nitride can be removed, for example, by immersing the semiconductor substrate in hot phosphoric acid. Hot phosphoric acid etches silicon nitride at a much higher etch rate than it etches silicon oxide, or even nitrided silicon oxide. If the nitrided silicon oxide is heavily nitrided, i.e., contains significant amounts of nitrogen and is thus susceptible to etch by the hot phosphoric acid, the potential loss of thickness of the STI can be at least partially compensated for by adjusting either or both of the deglaze removal of deposited oxide and the thickness of nitrided layer 220.

Following the nitridation of the STI oxide and the removal of the etch mask, the fabrication of IC 200 continues in the conventional manner. A number of the ensuing process steps require the etching of oxide layers and other steps, such as cleaning steps, involving the use of hydrofluoric acid and other solutions that would attack STI oxide if that STI oxide was not protected by a nitrided layer. Etch attack of the unprotected STI oxide can lead to a topography disparity which, in turn, can lead to photolithography problems. Etch attack can also lead to a problem known as "silicide wraparound" in which the metal silicide formed to reduce contact resistance forms along the edge of the etched STI and leads to source or drain leakage to a well region. In accordance with embodiments of this invention the STI oxide is protected from such deleterious etching by the formation of the nitrided oxide layer formed at least on the surface of the STI.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor IC comprising:
   providing a semiconductor substrate;
   forming an etch mask having an opening exposing a portion of the semiconductor substrate;
   etching the portion to form a trench extending into the semiconductor substrate;
   depositing an oxide to at least partially fill the trench;
   plasma nitriding at least a surface portion of the oxide to form a nitrided oxide layer, wherein plasma nitriding comprises:
      inserting the semiconductor substrate into a plasma reactor;
      heating the semiconductor substrate;
      initiating a high frequency source to ignite a nitrogen-containing plasma; and
      initiating a low frequency source to bias ion flow to the surface portion of the oxide; and
   removing the etch mask.

2. The method of claim 1 wherein plasma nitriding comprises exposing the surface portion of the oxide to the nitrogen-containing plasma that comprises $NH_3$ and an element selected from the group consisting of argon, nitrogen, helium, and mixtures thereof.

3. The method of claim 1 wherein plasma nitriding comprises exposing the surface portion of the oxide to the nitrogen-containing plasma that comprises nitrogen and an element selected from the group consisting of helium, argon, and mixtures thereof.

4. The method of claim 1 wherein plasma nitriding comprises exposing the surface portion of the oxide to the nitrogen-containing plasma that comprises $NF_3$ as a reactant.

5. The method of claim 1 further comprising deglazing the surface portion of the oxide before plasma nitriding.

6. The method of claim 5 wherein forming the etch mask comprises forming a patterned layer of silicon nitride having an opening therethrough.

7. The method of claim 1 further comprising controlling the low frequency source in the range of 50-1000 watts to control thickness of the nitrided oxide layer.

8. The method of claim 1 further comprising planarizing the surface of the oxide prior to plasma nitriding.

9. The method of claim 1 wherein the nitrogen-containing plasma comprises $NH_3$ and an element selected from the group consisting of helium, argon, and nitrogen.

10. The method of claim 1 wherein high frequency power in the plasma reactor and duration of subjecting the surface of the oxide material to the nitrogen-containing plasma are adjusted to control the amount of nitrogen incorporated in the nitrided oxide layer.

11. A method for fabricating a semiconductor IC comprising:
    depositing a layer of silicon nitride overlying a semiconductor substrate;
    applying and patterning a layer of photoresist to form an etch mask having an opening exposing a portion of the layer of silicon nitride;
    etching the portion of the layer of silicon nitride;
    etching a trench extending into the semiconductor substrate underlying the portion of the layer of silicon nitride;
    filling the trench with an oxide material;
    performing a CMP operation to remove the oxide material overlying the layer of silicon nitride;
    deglazing a surface of the oxide material within the trench; and
    forming a nitrided oxide layer at the surface of the oxide material by subjecting the surface of the oxide material to a nitrogen-containing plasma, wherein forming the nitrided oxide layer comprises subjecting the surface of the oxide material to a nitrogen plasma comprising $NH_3$ as a reactant, and in at least one cycle to a nitrogen plasma comprising $NF_3$ as a reactant.

12. The method of claim 11 wherein forming the nitrided oxide layer comprises:
    placing the semiconductor substrate in a plasma reactor;
    initiating the nitrogen plasma; and
    controlling the thickness of the nitrided oxide layer by controlling a low frequency power source in the plasma reactor.

13. The method of claim 12 further comprising controlling the amount of nitrogen incorporated in the nitrided oxide layer by controlling a high frequency power source in the plasma reactor.

14. The method of claim 11 wherein deglazing the surface of the oxide material comprises etching the oxide material to remove oxide material remaining overlying the layer of silicon nitride and to adjust the thickness of oxide material in the trench.

15. A method for fabricating a semiconductor IC in and on a semiconductor substrate comprising:
    etching an isolation trench extending into the surface of a semiconductor substrate;
    substantially filling the trench with an oxide material;
    performing a planarizing operation to remove a portion of the oxide material and to expose a surface of the oxide material in the trench;
    plasma nitriding a portion of the oxide material to form a nitrided oxide layer at the surface, wherein plasma nitriding comprises subjecting the surface of the oxide material to a nitrogen-containing plasma in a plasma reactor, and wherein low frequency power in the plasma reactor is adjusted to control thickness of the nitrided oxide layer.

16. The method of claim 15 further comprising etching the oxide material to control the depth of the surface of the oxide material relative to the surface of the semiconductor material.

* * * * *